United States Patent
Sakai

(10) Patent No.: US 12,453,241 B2
(45) Date of Patent: Oct. 21, 2025

(54) DISPLAY DEVICE AND METHOD FOR MANUFACTURING DISPLAY DEVICE

(71) Applicant: SHARP KABUSHIKI KAISHA, Sakai (JP)

(72) Inventor: Tamotsu Sakai, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 385 days.

(21) Appl. No.: 18/034,343

(22) PCT Filed: Oct. 30, 2020

(86) PCT No.: PCT/JP2020/040839
§ 371 (c)(1),
(2) Date: Apr. 27, 2023

(87) PCT Pub. No.: WO2022/091348
PCT Pub. Date: May 5, 2022

(65) Prior Publication Data
US 2024/0306425 A1    Sep. 12, 2024

(51) Int. Cl.
*H10K 59/12*       (2023.01)
*H10K 59/121*      (2023.01)
*H10D 86/40*       (2025.01)
*H10D 86/60*       (2025.01)

(52) U.S. Cl.
CPC ..... *H10K 59/1201* (2023.02); *H10K 59/1213* (2023.02); *H10D 86/421* (2025.01); *H10D 86/60* (2025.01)

(58) Field of Classification Search
CPC .......... H10K 59/1201; H10K 59/1213; H10D 86/421; H10D 86/60; H10D 30/021; H10D 30/67; G02F 1/1368; G09G 3/3233; H05B 33/02; H05B 33/14
See application file for complete search history.

(56) References Cited

U.S. PATENT DOCUMENTS 8,174,633 B2 * 5/2012 Segawa ............. G02F 1/136209
349/44
2006/0214229 A1   9/2006 Toyoda et al.

FOREIGN PATENT DOCUMENTS

| JP | 2006269808 A | 10/2006 |
| JP | 2009043748 A | 2/2009 |
| JP | 2010113151 A | 5/2010 |

* cited by examiner

*Primary Examiner* — Tan N Tran
(74) *Attorney, Agent, or Firm* — ScienBiziP, P.C.

(57) ABSTRACT

A semiconductor layer of a drive transistor includes a first channel region, and a first doped region and a second doped region that are doped with an impurity, the first doped region adjacent to the first channel region is constituted by a high concentration region, and the second doped region is constituted by a low concentration region adjacent to the first channel region and a high concentration region adjacent to the low concentration region, and a drive current flows from the first doped region to the second doped region in a light emission period of a light-emitting element.

19 Claims, 12 Drawing Sheets

(a)

(b)

(c)

DISPLAY DEVICE AND METHOD FOR MANUFACTURING DISPLAY DEVICE

TECHNICAL FIELD

The disclosure relates to a display device and a method for manufacturing a display device.

BACKGROUND ART

PTL 1 discloses a method of forming a drain region (impurity introduction region) of a semiconductor layer of an electro-optical device by using a low concentration region (LDD region) and a high concentration region.

CITATION LIST

Patent Literature

PTL 1: JP 2009-43748 A

SUMMARY OF INVENTION

Technical Problem

To achieve both improvement of drive capability of a drive transistor and reduction of an off current in a pixel circuit for a light-emitting element.

Solution to Problem

A display device according to an aspect of the disclosure includes a light-emitting element, and a pixel circuit including a transistor including a first structure, a semiconductor layer of the transistor including the first structure includes a first channel region, and a first doped region and a second doped region disposed at both sides of the first channel region, the first doped region and the second doped region being doped with an impurity, the first doped region adjacent to the first channel region is constituted by a high concentration region, the second doped region is constituted by a low concentration region adjacent to the first channel region and a high concentration region adjacent to the low concentration region, the high concentration region included in the semiconductor layer of the transistor including the first structure has a higher doping concentration than a doping concentration of the low concentration region included in the semiconductor layer, the pixel circuit includes a drive transistor serving as the transistor including the first structure and a capacitance element connected to a gate electrode of the drive transistor, and a drive current flows from the first doped region to the second doped region of the drive transistor in a light emission period of the light-emitting element.

Advantageous Effects of Disclosure

According to one aspect of the disclosure, both improvement of drive capability and reduction of an off current of the drive transistor can be achieved.

DESCRIPTION OF EMBODIMENTS

Figure 1:
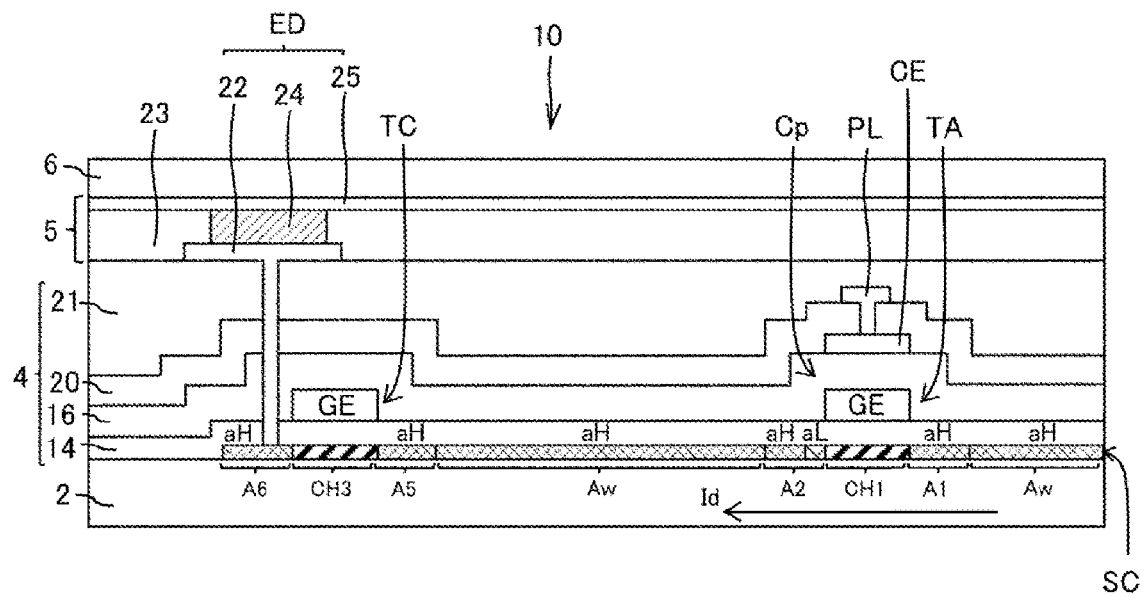
FIG. 1 (a) is a cross-sectional view of a display device according to a first embodiment including a transistor having a first structure and a transistor having a third structure, and FIG. 1 (b) is a cross-sectional view of the display device according to the first embodiment including a transistor having a second structure.
Figure 1:
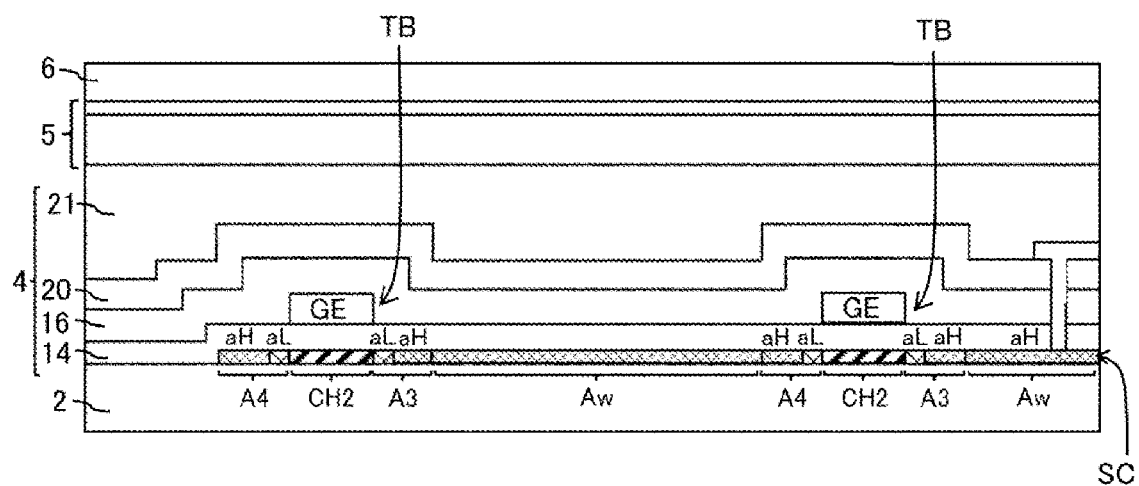
Figure 2:
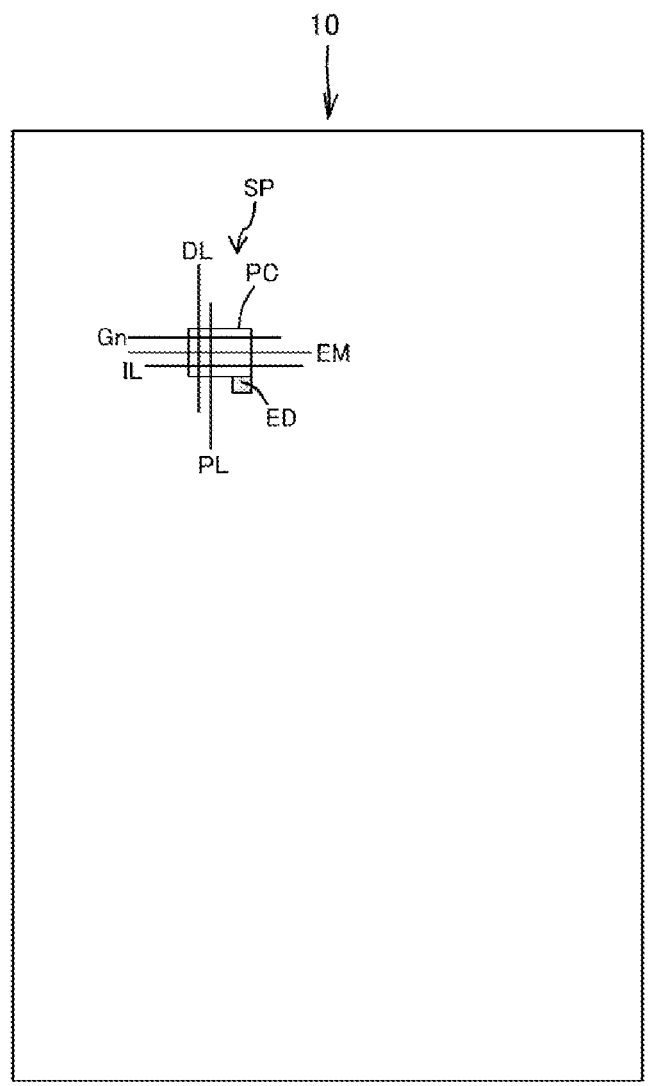
FIG. 2 is a schematic plan view illustrating a configuration of the display device according to the first embodiment.

FIG. 1 (a) is a cross-sectional view of a display device according to a first embodiment including a transistor having a first structure and a transistor having a third structure, and FIG. 1 (b) is a cross-sectional view of the display device according to the first embodiment including a transistor having a second structure. FIG. 2 is a schematic plan view illustrating a configuration of the display device according to the first embodiment.

As illustrated in FIG. 1 and FIG. 2, in a display device 10, a substrate 2, a thin film transistor layer 4 including a pixel circuit PC, a light-emitting element layer 5 including a light-emitting element ED of a top emission (that emits light to an upper-layer side) type, and a sealing layer 6 are formed in this order, and the light-emitting element ED and the pixel circuit PC are provided for each of subpixels SP.

The substrate 2 is a glass substrate or a flexible base material including resin such as polyimide as a main component, and for example, the substrate 2 may be constituted by two layers of polyimide films and an inorganic film interposed therebetween. A base coat film (inorganic insulating film) for preventing intrusion of foreign matter such as water and/or oxygen may be provided on an upper face of the substrate 2 (interface with a semiconductor layer SC).

As illustrated in FIG. 1, the thin film transistor layer 4 includes the semiconductor layer SC formed on the substrate 2, a gate insulating film 14 covering the semiconductor layer SC, a first metal layer formed at an upper layer compared to the gate insulating film 14 and including a gate electrode GE, a first interlayer insulating film 16 covering the first metal layer, a second metal layer formed at an upper layer than the first interlayer insulating film 16 and including a capacitance electrode CE, a second interlayer insulating film 20 covering the second metal layer, a third metal layer formed at an upper layer compared to the second interlayer insulating film 20 and including a power source line PL and an initialization signal line IL, and a flattening film 21 formed at an upper layer compared to the third metal layer.

The semiconductor layer SC is made of, for example, Low-Temperature PolySilicon (LTPS). The semiconductor layer SC functions as a semiconductor (channel) in a portion overlapping the gate electrode GE, and serves as a conductor in a portion not overlapping the gate electrode GE by impurity doping or the like.

Each of the first metal layer, the second metal layer, and the third metal layer is constituted by a metal single layer film or a metal multilayer film including at least one of aluminum, tungsten, molybdenum, tantalum, chromium, titanium, and copper, for example.

The gate insulating film 14 can be constituted by a silicon oxide (SiOx) film, for example. The first interlayer insulating film 16 covering the gate electrode GE can be constituted by, for example, a layered film of silicon oxide (SiOx) and silicon nitride (SiNx). The second interlayer insulating film 20 can be constituted by a single layer film of silicon oxide (SiOx) or a layered film of silicon oxide (SiOx) and silicon nitride (SiNx). The flattening film 21 can be formed of, for example, a coatable organic material such as polyimide or acrylic resin.

The light-emitting element layer 5 includes a lower electrode 22, an edge cover film 23 having insulating properties and covering an edge of the lower electrode 22, an ElectroLuminescent (EL) layer 24 provided at an upper layer compared to the edge cover film 23, and an upper electrode 25 at an upper layer compared to the EL layer 24. The edge cover film 23 is formed by applying an organic material such as polyimide or acrylic resin and then patterning the organic material by photolithography, for example.

The light-emitting element layer 5 is formed with a plurality of light-emitting elements ED having different luminescent colors, and each light-emitting element includes the lower electrode 22 having island shapes, the EL layer 24 including a light-emitting layer, and the upper electrode 25. The upper electrode 25 is a common electrode that has a solid-like shape and that is common among the plurality of light-emitting elements ED.

The light-emitting element ED may be, for example, an Organic Light-Emitting Diode (OLED) including an organic layer as a light-emitting layer, or may be a Quantum dot Light Emitting Diode (QLED) including a quantum dot layer as a light-emitting layer.

For example, the EL layer 24 is formed by layering a hole injection layer, a hole transport layer, a light-emitting layer, an electron transport layer, and an electron injection layer in this order, from the lower layer side. The light-emitting layer is formed into an island shape at an opening of the edge cover film 23 (on a subpixel-by-subpixel basis) by a vapor deposition method, an ink-jet method, or a photolithography method. Other layers are formed in an island shape or a solid-like shape (common layer). A configuration can also be adopted in which one or more layers are not formed among the hole injection layer, the hole transport layer, the electron transport layer, and the electron injection layer.

The lower electrode (anode) 22 is a light-reflecting electrode formed by layering Indium Tin Oxide (ITO) and silver (Ag) or an alloy containing Ag, for example. The upper electrode (cathode) 25 is constituted by a metal thin film made of, for example, a magnesium silver alloy or the like, and has optical transparency.

In a case where the light-emitting element ED is an OLED, positive holes and electrons recombine inside the light-emitting layer in response to a drive current between the lower electrode 22 and the upper electrode 25, and light is emitted when excitons generated in this manner are shifted to a ground state. In a case where the light-emitting element ED is an QLED, positive holes and electrons recombine inside the light-emitting layer in response to a drive current between the lower electrode 22 and the upper electrode 25, and light is emitted when excitons generated in this manner are shifted from a conduction band of a quantum dot to a valence band.

The sealing layer 6 covering the light-emitting element layer 5 is a layer that prevents penetration of foreign matter such as water or oxygen into the light-emitting element layer 5, and for example, the sealing layer 6 can include two inorganic sealing films and an organic film formed therebetween.

First Embodiment

As illustrated in FIG. 1 and FIG. 2, the pixel circuit PC includes a transistor TA having a first structure, a transistor TB having a second structure, and a transistor TC having a third structure. Each of the transistor TA having the first structure, the transistor TB having the second structure, and the transistor TC having the third structure is a P-type transistor (P-type channel type), and is a top-gate type where a gate electrode is formed at a layer higher than a channel region.

The semiconductor layer SC of the transistor TA having the first structure includes a first channel region CH1, and a first doped region A1 and a second doped region A2 that are disposed at both sides of the first channel region CH1 and that are doped with an impurity. The first channel region CH1 is aligned with a gate electrode GE of the transistor TA.

The semiconductor layer SC of the transistor TB having the second structure includes a second channel region CR2, and a third doped region A3 and a fourth doped region A4 that are disposed at both sides of the second channel region CR2 and that are doped with an impurity. The second channel region CH2 is aligned with a gate electrode GE of the transistor TB.

The semiconductor layer SC of the transistor TC having the third structure includes a third channel region CR3, and a fifth doped region A5 and a sixth doped region A6 that are disposed at both sides of the third channel region CR3 and that are doped with an impurity. The third channel region CH3 is aligned with a gate electrode GE of the transistor TC.

As illustrated in FIG. 1, as for the transistor TA having the first structure, the first doped region A1 adjacent to one side of the first channel region CH1 is constituted by a high concentration region aH, and the second doped region A2 adjacent to the other side of the first channel region CH1 is constituted by a low concentration region aL adjacent to the first channel region CH1 and a high concentration region aH adjacent to the low concentration region aL.

As for the transistor TB having the second structure, the third doped region A3 adjacent to one side of the second channel region CH2 is constituted by a low concentration region aL adjacent to the second channel region CH2 and a high concentration region aH adjacent to the low concentration region aL, and the fourth doped region A4 adjacent to the other side of the second channel region CH2 is constituted by a low concentration region aL adjacent to the second channel region CH2 and a high concentration region aH adjacent to the low concentration region aL.

As for the transistor TC having the third structure, the fifth doped region A5 adjacent to one side of the third channel region Cl3 is constituted by a high concentration region al, and the sixth doped region A6 adjacent to the other side of the third channel region CH3 is constituted by a high concentration region aH.

In the transistors TA, TB, and TC, for example, a doping concentration of the high concentration region aH is equal to or more than 10 times a doping concentration of the low concentration region aL.

Figure 3:
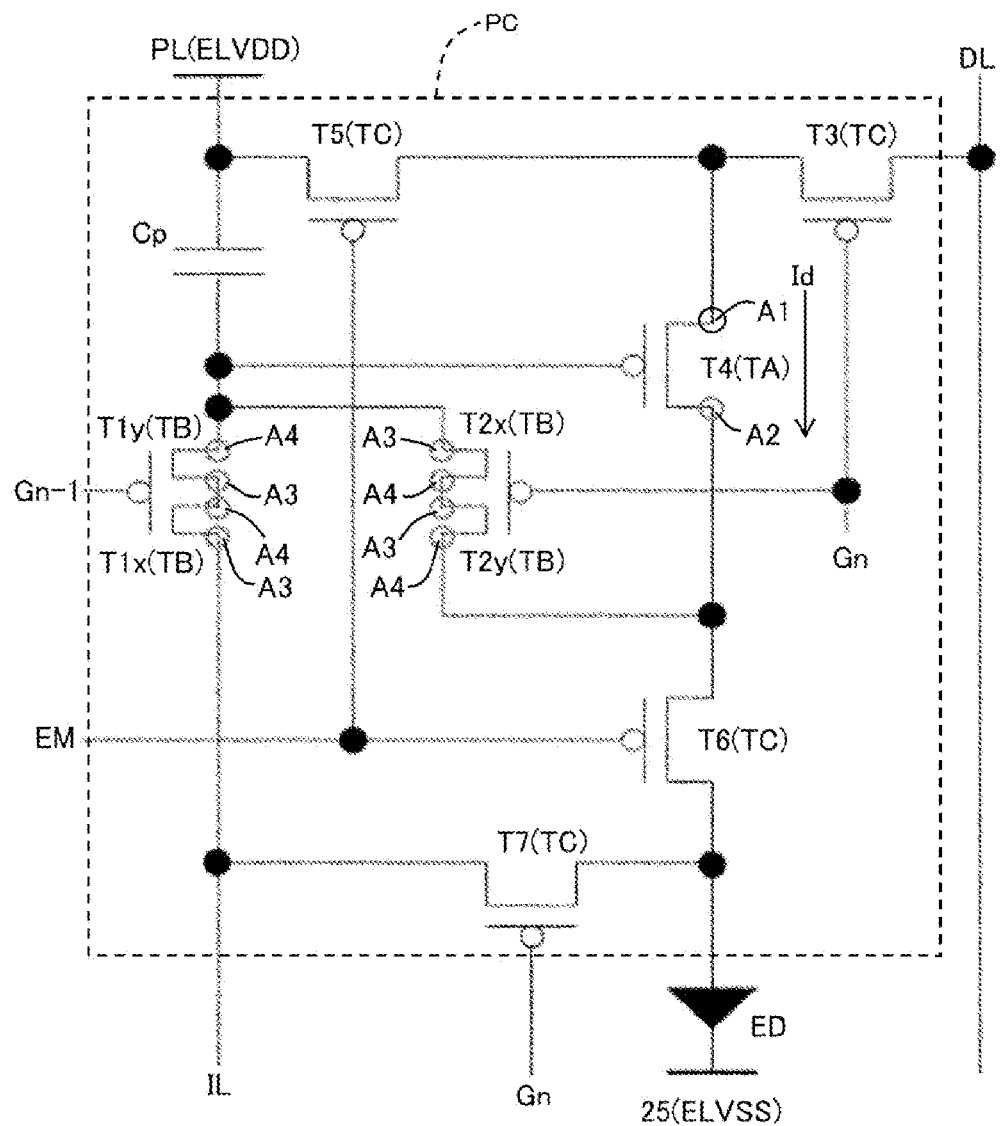
FIG. 3 is a circuit diagram illustrating an example of a pixel circuit.

FIG. 3 is a circuit diagram illustrating an example of the pixel circuit. The pixel circuit PC illustrated in FIG. 3 includes a capacitance element Cp, reset transistors T1$x$ and T1$y$ whose gate electrode is connected to a scanning signal line Gn−1 of a previous stage (n−1 stage), threshold control transistors T2$x$ and T2$y$ whose gate electrode is connected to a scanning signal line (in of a current stage (n stage), a writing control transistor T3 whose gate electrode is connected to a scanning signal line (in of the current stage (n stage), a drive transistor T4 that controls a current of the light-emitting element ED, a power supply transistor T5 whose gate electrode is connected to a light emission control line EM (n stage), a light emission control transistor T6 whose gate electrode is connected to the light emission control line EM (n stage), and an initialization transistor T7 whose gate electrode is connected to the scanning signal line Gn of the current stage (n stage).

The scanning signal lines Gn and Gn−1 and the light emission control line EM are included in the first metal layer, and a data signal line DL, a power source line PL, and an initialization signal line are included in the third metal layer. A part of the scanning signal line Gn or a part of the scanning signal line Gn−1, or a part of the light emission control line EM may function as the gate electrodes GE of the transistors other than the drive transistor T4. The drive transistor T4 is the transistor TA having the first structure, each of the reset transistors T1$x$ and T1$y$ and the threshold control transistors T2$x$ and T2$y$ is the transistor TB having the second structure, and each of the writing control transistor T3, the power supply transistor T5, the light emission control transistor T6, and the initialization transistor T7 is the transistor TC having the third structure.

The gate electrode GE of the drive transistor T4 is connected to the power source line PL via the capacitance element Cp, and is connected to the initialization signal line IL via the reset transistors T1$x$ and T1$y$. The power source line PL is supplied with a high voltage side power supply (ELVDD), and the initialization signal line IL and the cathode (upper electrode 25) of the light-emitting element ED are supplied with, for example, the same low voltage side power supply (ELVSS).

The first doped region (source region) A1 of the drive transistor T4 is connected to the data signal line DL via the writing control transistor T3, and is connected to the power source line PL via the power supply transistor T5. The second doped region (drain region) A2 of the drive transistor T4 is connected to the anode (lower electrode 22) of the light-emitting element ED via the light emission control transistor T6, and is also connected to the gate electrode GE of the drive transistor T4 via the two threshold control transistors T2$x$ and T2$y$ connected in series. The anode of the light-emitting element ED is connected to the initialization signal line IL via the initialization transistor 17.

Figure 4:
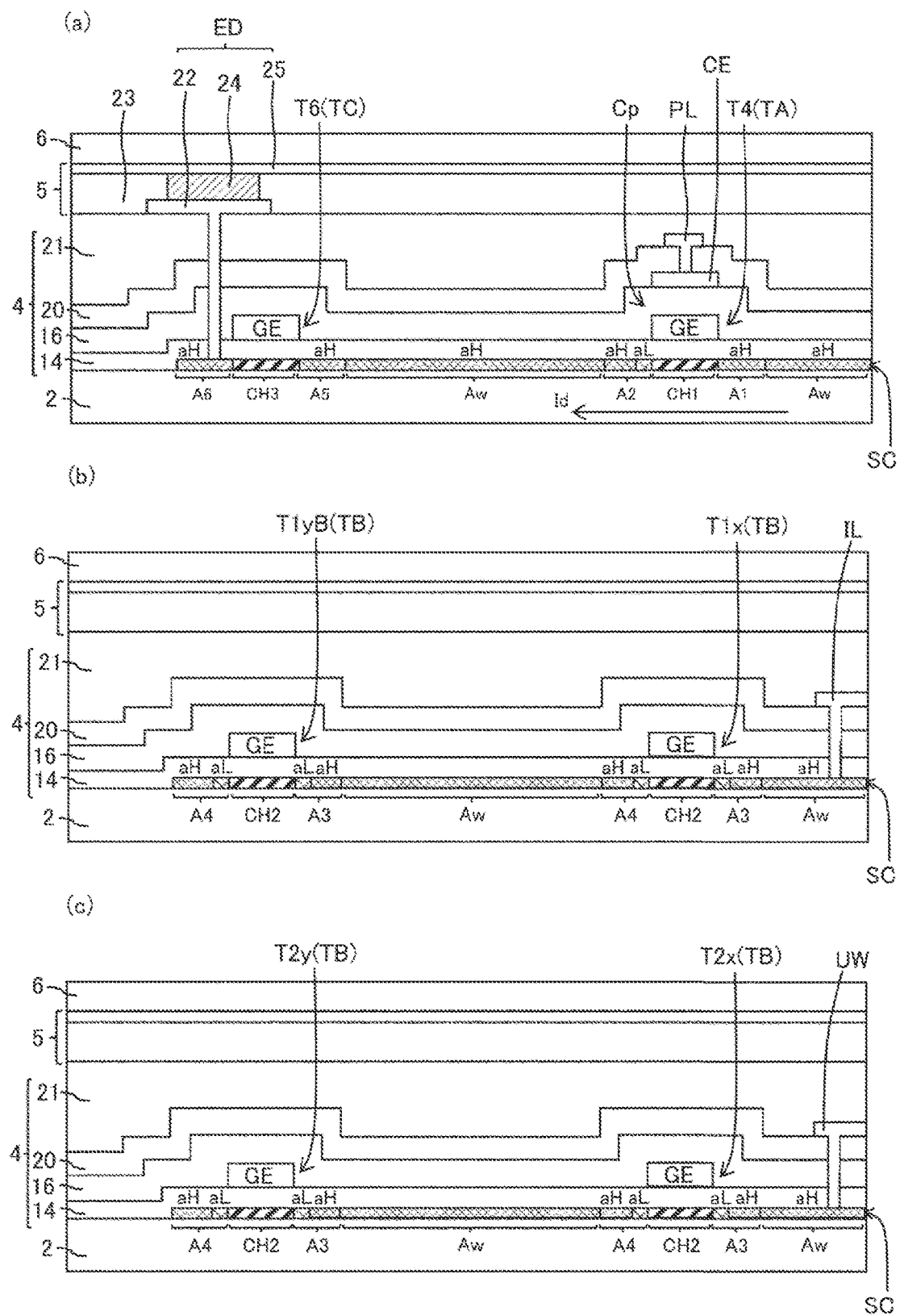
FIG. 4 (a) is a cross-sectional view illustrating a configuration example of a portion including a drive transistor and a light emission control transistor in a pixel circuit, FIG. 4 (b) is a cross-sectional view illustrating a configuration example of a portion including a reset transistor in the pixel circuit, and FIG. 4 (c) is a cross-sectional view illustrating a configuration example of a portion including a threshold control transistor in the pixel circuit.

FIG. 4($a$) is a cross-sectional view illustrating a configuration example of a portion including the drive transistor and the light emission control transistor in the pixel circuit, FIG. 4($b$) is a cross-sectional view illustrating a configuration example of a portion including the reset transistor in the pixel circuit, and FIG. 4($c$) is a cross-sectional view illustrating a configuration example of a portion including the threshold control transistor in the pixel circuit.

As illustrated in FIG. 3 and FIG. 4($a$), the capacitance element Cp is formed so as to include the gate electrode GE of the drive transistor T4 (TA) and the capacitance electrode CE, and the capacitance electrode CE is connected to the power source line PL through a contact hole formed in the second interlayer insulating film 20.

As illustrated in FIG. 4($a$), the second doped region A2 of the drive transistor T4 (TA) is connected to the lower electrode 22 (anode) of the light-emitting element ED via the light emission control transistor T6 (TC), and a drive current Id flows from the first doped region A1 serving as the source region of the drive transistor T4 (TA) to the second doped region A2 serving as the drain region in the light emission period of the light-emitting element ED. The second doped region A2 of the drive transistor T4 and the fifth doped region A5 of the light emission control transistor T6 are connected to each other with a wiring region Aw of the semiconductor layer SC interposed therebetween. The wiring region Aw is a conductor portion constituted by a high concentration region aH. The drive current Id flows into the light-emitting element ED through the wiring region Aw, the fifth doped region A5, the third channel region CH3, and the sixth doped region A6 of the light emission control transistor T6.

As described above, the drive transistor T4 serves as the transistor TA having the first structure, the first region A1 serving as the source region is constituted by the high concentration region aH, and the second region A2 serving as the drain region is constituted by the low concentration region aL adjacent to the first channel region CH1 and the high concentration region aH, which can achieve both improvement of the drive capability of the drive transistor T4 and reduction of an off current.

As illustrated in FIG. 4($b$), a pair of reset transistors T1$x$ and T1$y$ (TBs) are connected in series, and the fourth doped region A4 of the reset transistor T1$x$ and the third doped region A3 of the reset transistor T1$y$ are connected via the wiring region Aw. The third doped region A3 of the reset transistor T1$x$ is connected to the initialization signal line IL via the wiring region Aw of the semiconductor layer SC.

As illustrated in FIG. 4($c$), a pair of the threshold control transistors T2$x$ and T2$y$ (TBs) are connected in series, and the fourth doped region A4 of the threshold control transistor T2$x$ and the third doped region A3 of the threshold control transistor T2$y$ are connected to each other via the wiring region Aw. The third doped region A3 of the threshold control transistor T2$x$ is connected to an upper layer wiring line UW via the wiring region Aw of the semiconductor layer SC.

As described above, each of the reset transistors T1$x$ and T1$y$ and the threshold control transistors T2$x$ and T2$y$ serves as the transistor TB having the second structure, and each of the third doped region A3 and the fourth doped region A4 is constituted by the low concentration region aL adjacent to the second channel region CH2 and the high concentration region aH. Thus, an off current of the reset transistors and the threshold control transistors can be reduced.

Each of the writing control transistor T3, the power supply transistor T5, the light emission control transistor T6, and the initialization transistor T7 serves as the transistor TC having the third structure, and each of the fifth doped region A5 and the sixth doped region A6 that are adjacent to the third channel region CH3 is constituted by the high concentration region aH. Thus, an ON current of each of the transistors T3, T5, T6, and T7 can be secured. Note that in order to reduce an off current, the initialization transistor T7 may serve as the transistor TB having the second structure.

In the first embodiment, the transistors T1 to T7 of the pixel circuit PC are separately formed as the transistor TA having the first structure, the second transistor TB, and the third transistor TC according to the functions. Thus, it is possible to optimize the performance of the transistors T1 to T7 and achieve a pixel circuit having high luminance and high reliability.

Figure 5:
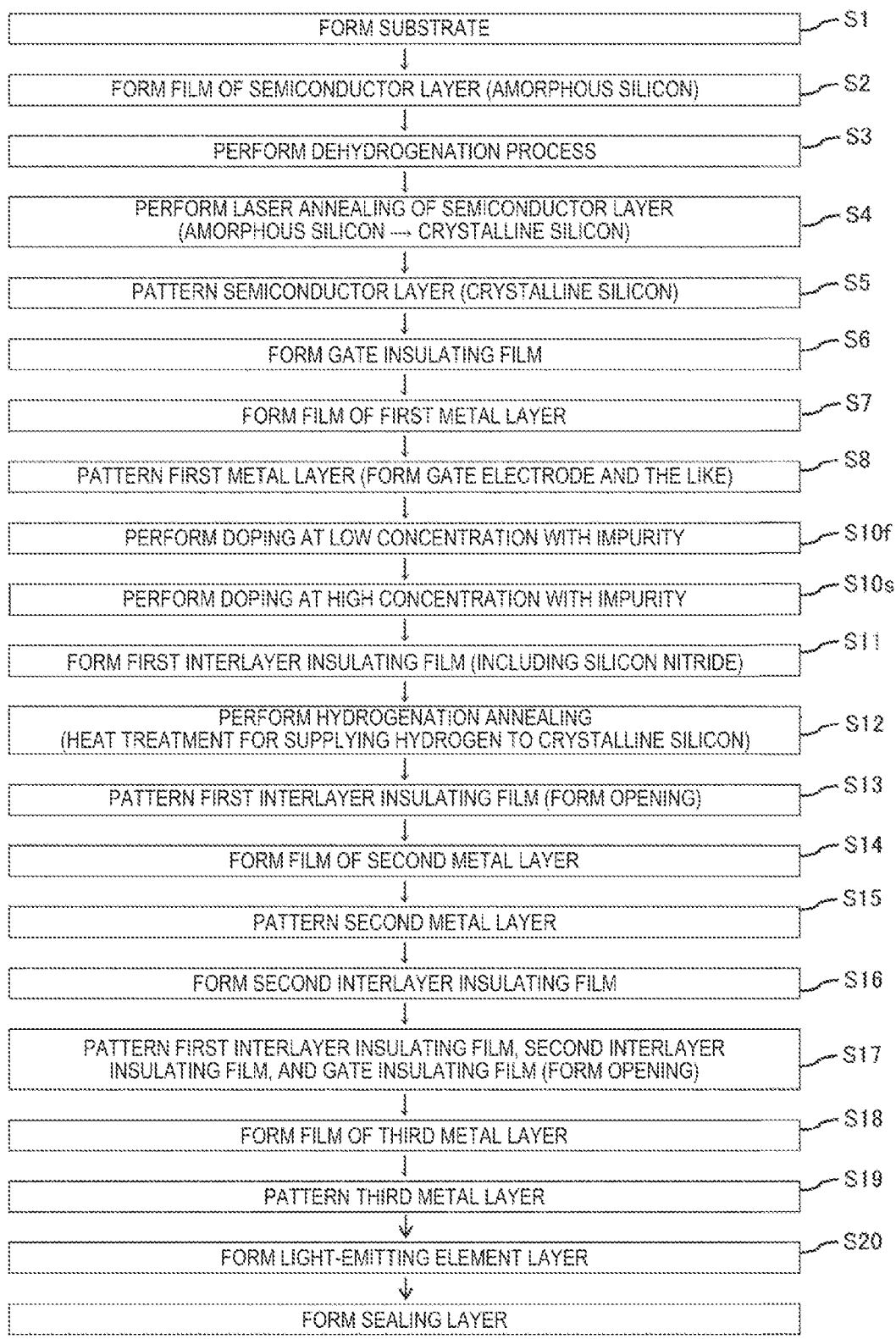
FIG. 5 is a flowchart illustrating a method for manufacturing the display device according to the first embodiment.
Figure 6:
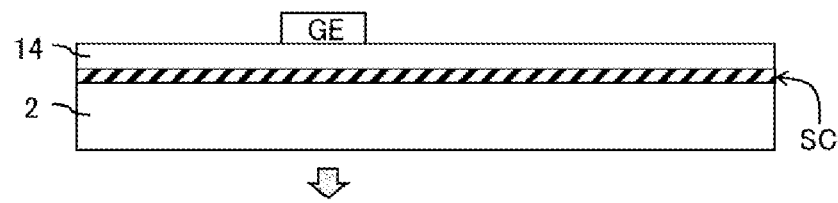
FIG. 6 is a cross-sectional view illustrating a method for manufacturing the transistor having the first structure according to the first embodiment.
Figure 6:
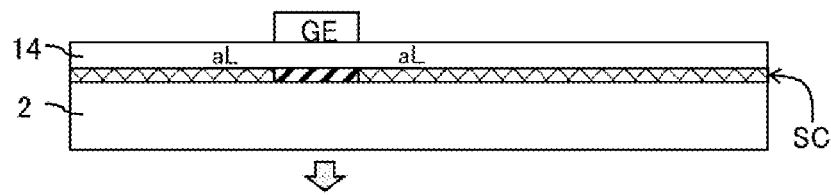
Figure 6:
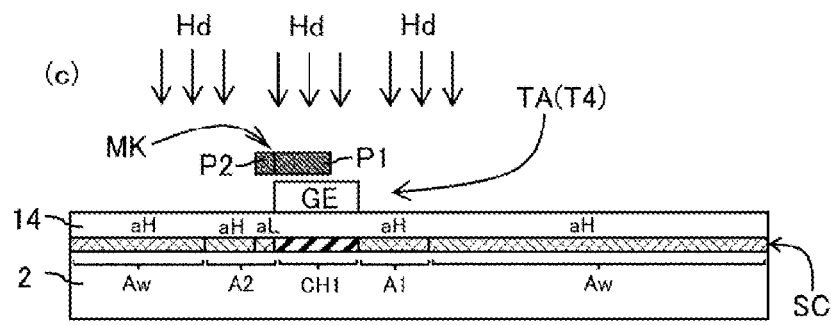
Figure 7:
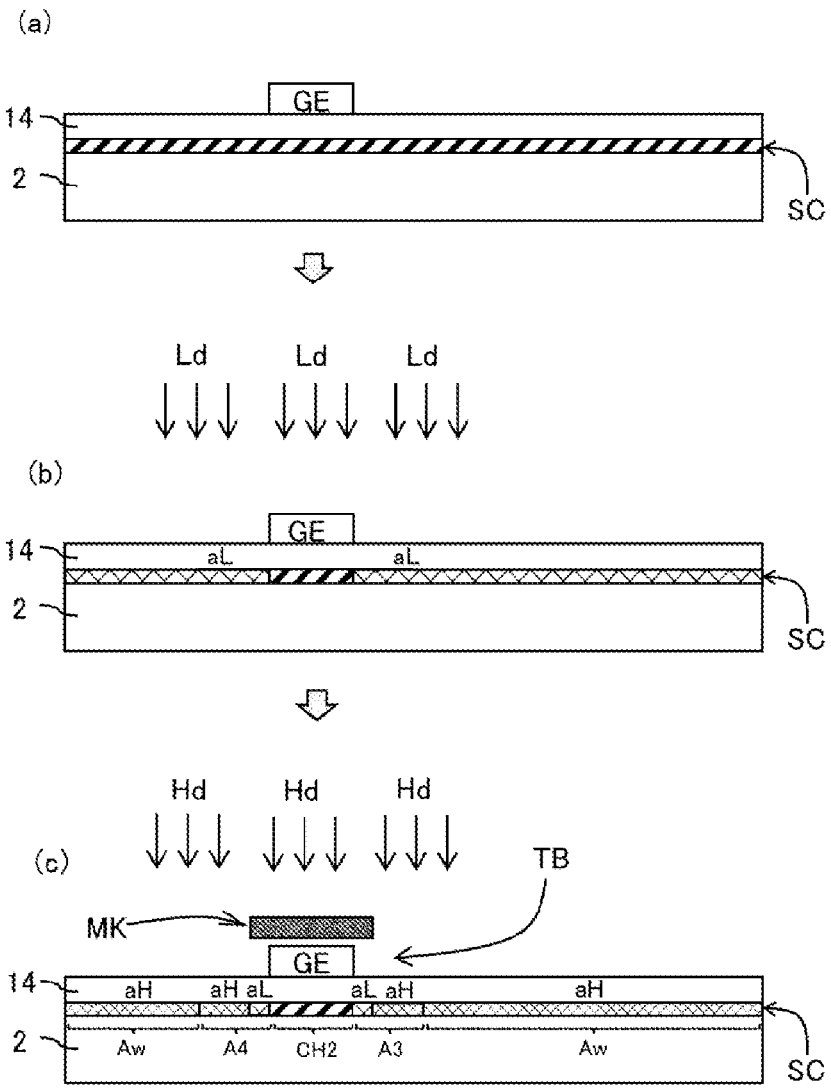
FIG. 7 is a cross-sectional view illustrating a method for manufacturing the transistor having the second structure according to the first embodiment.
Figure 8:
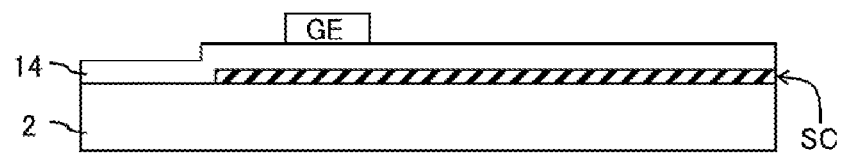
FIG. 8 is a cross-sectional view illustrating a method for manufacturing the transistor having the third structure according to the first embodiment.
Figure 8:
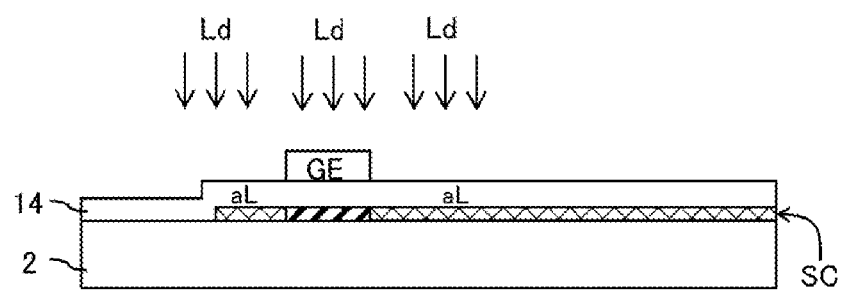
Figure 8:
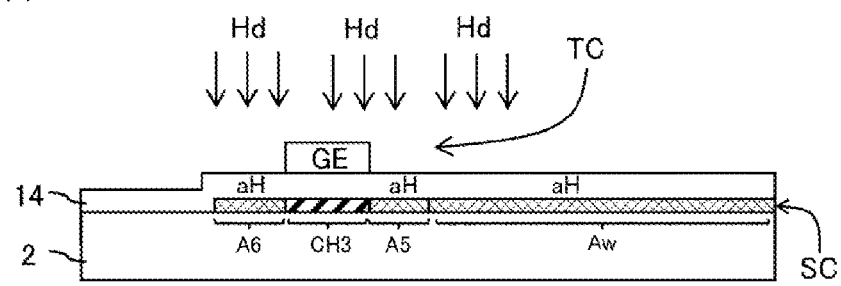

FIG. 5 is a flowchart illustrating a method for manufacturing the display device according to the first embodiment. FIG. 6 is a cross-sectional view illustrating the method for manufacturing the transistor having the first structure according to the first embodiment. FIG. 7 is a cross-sectional view illustrating the method for manufacturing the transistor having the second structure according to the first embodiment. FIG. 8 is a cross-sectional view illustrating the method for manufacturing the transistor having the third structure according to the first embodiment.

As illustrated in FIG. 5, in Step S1, the substrate 2 (including a base coat film) is formed. In Step S2, a film of amorphous silicon is formed. In Step S3, dehydrogenation of the amorphous silicon is performed by heat treatment. In Step S4, laser annealing is performed by an Excimer Laser Annealing (ELA) method to change the amorphous silicon into the semiconductor layer SC made of polysilicon. In Step S5, the semiconductor layer SC is patterned by a photolithography method.

In Step S6, the gate insulating film 14 (for example, a film of silicon oxide) is formed by using a CVA method. In Step S7, a film of the first metal layer (molybdenum or a molybdenum-based alloy such as MoW) is formed by a sputtering method. In Step S8, the first metal layer is patterned (the gate electrode GE and the like are formed) by a photolithography method.

In Step S10f, the gate electrode GE is used as a shield to perform doping at a low concentration on the semiconductor layer SC with an impurity (see FIG. 6(b), FIG. 7(b), and FIG. 8(b)). For example, boron is used as the impurity, and the doping concentration is set to from $3.0 \times 10^{16}$ to $2 \times 10^{17}$ [atoms/cm$^3$], for example. Thus, the low concentration region aL is formed.

In Step S10s, the gate electrode GE and a mask MK are used as shields to perform doping at a high concentration on the semiconductor layer SC with an impurity (see FIG. 6(c), FIG. 7(c), and FIG. 8(c)). For example, boron is used as the impurity, and the doping concentration is set to from $1.0 \times 10^{19}$ to $1.0 \times 10^{21}$ [atoms/cm$^3$], for example. Thus, the high concentration region aH is formed.

As illustrated in FIG. 6(c), for the semiconductor layer SC of the transistor TA (T4) having the first structure, the mask MK including a first portion P1 overlapping the gate electrode GE and a second portion P2 overlapping any one of both sides of the gate electrode GE is used, and the mask MK and the gate electrode GE are used as shields to perform doping at a high concentration on a region of the semiconductor layer SC overlapping neither the mask MK nor the gate electrode GE. Thus, the first channel region CH1, the first doped region A1 (source region) constituted by the high concentration region aH, and the second doped region A2 (drain region) constituted by the low concentration region aL and the high concentration region aH are formed.

As illustrated in FIG. 7(c), a mask MK including a portion overlapping the gate electrode GE and portions overlapping both sides of the gate electrode GE is used for the semiconductor layer SC of the transistor TB having the second structure, and the mask MK and the gate electrode GE are used as shields to perform doping at a high concentration on a region of the semiconductor layer SC overlapping neither the mask MK nor the gate electrode GE. As a result, the second channel region CH2, the third doped region A3 constituted by the low concentration region aL and the high concentration region aH, and the fourth doped region A4 constituted by the low concentration region aL and the high concentration region aH are formed.

As illustrated in FIG. 8(c), a mask is not used for the semiconductor layer SC of the transistor TC having the third structure, and the gate electrode GE is used as a shield to perform doping at a high concentration on a region of the semiconductor layer SC not overlapping the gate electrode GE. Thus, the third channel region CR3, the fifth doped region A5 constituted by the high concentration region aH, and the sixth doped region A6 constituted by the high concentration region aH are formed.

In Step S11, the first interlayer insulating film 16 (for example, a layered film of silicon oxide and silicon nitride) is formed by using a CVA method. In Step S12, hydrogenation annealing (heat treatment for supplying hydrogen to the semiconductor layer SC made of crystalline silicon) is performed. In Step S13, patterning (opening formation) of the first interlayer insulating film 16 is performed by a photolithography method.

In Step S14, the second metal layer 19 (for example, a layered film of titanium/aluminum/titanium) is formed by a sputtering method. In Step S15, patterning of the second metal layer (formation of the capacitance electrode CE and the like) is performed by a photolithography method. In Step S16, the second interlayer insulating film 20 (for example, a single layer film of silicon oxide or a layered film of silicon nitride and silicon oxide) is formed by using a CVA method. In Step S17, the first interlayer insulating film 16, the second interlayer insulating film 20, and the gate insulating film 14 are patterned by a photolithography method In Step S18, a film of the third metal layer (for example, a layered film of titanium/aluminum/titanium) is formed by a sputtering method. In Step S19, patterning of the third metal layer (formation of the data signal line DL, the initialization signal line IL, the power source line PL, and the like) is performed by a photolithography method. In Step S20, the light-emitting element layer 5 is formed. In Step S21, the sealing layer 6 is formed.

Second Embodiment

Figure 9:
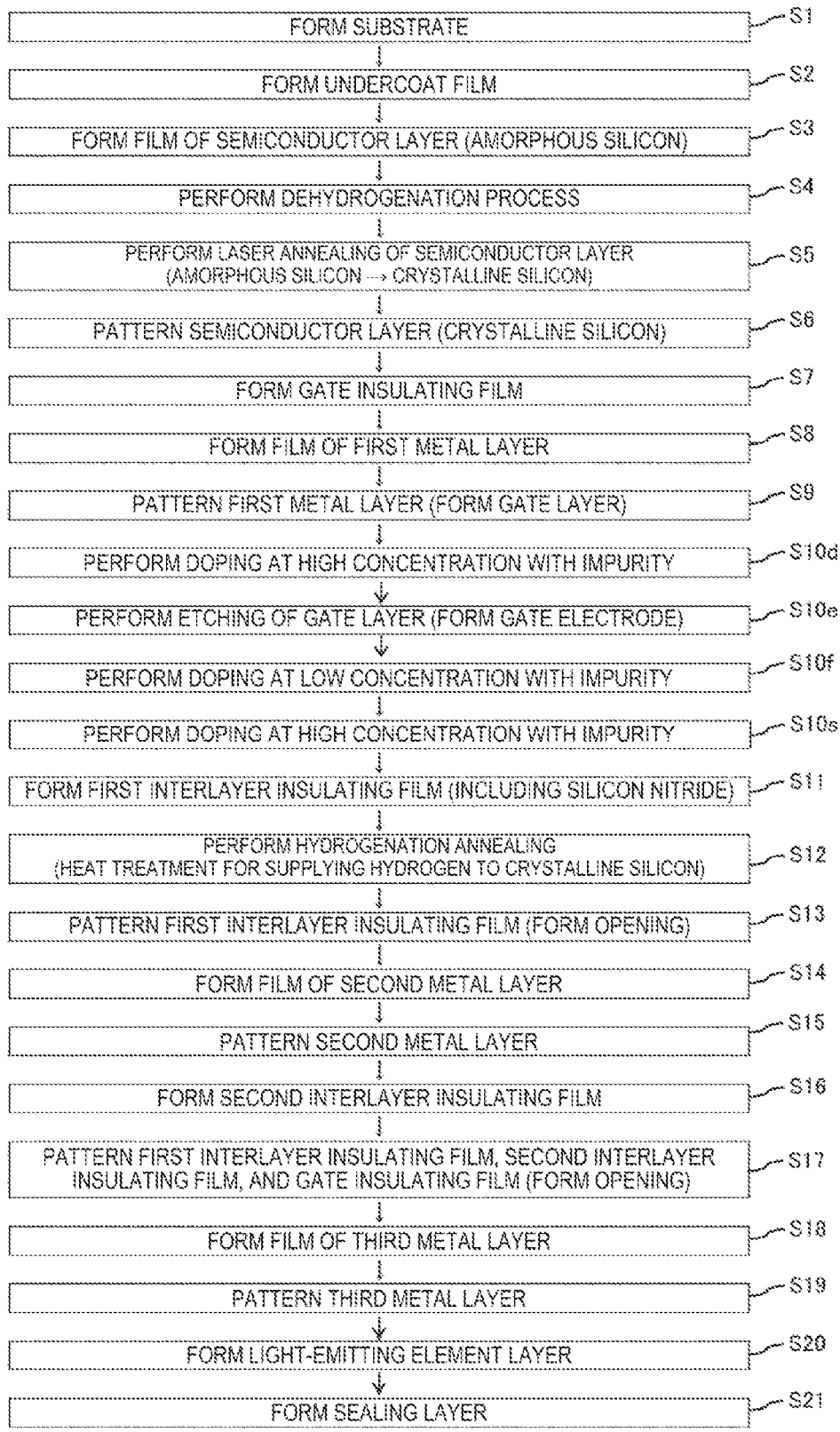
FIG. 9 is a flowchart illustrating a method for manufacturing a display device according to a second embodiment.
Figure 10:
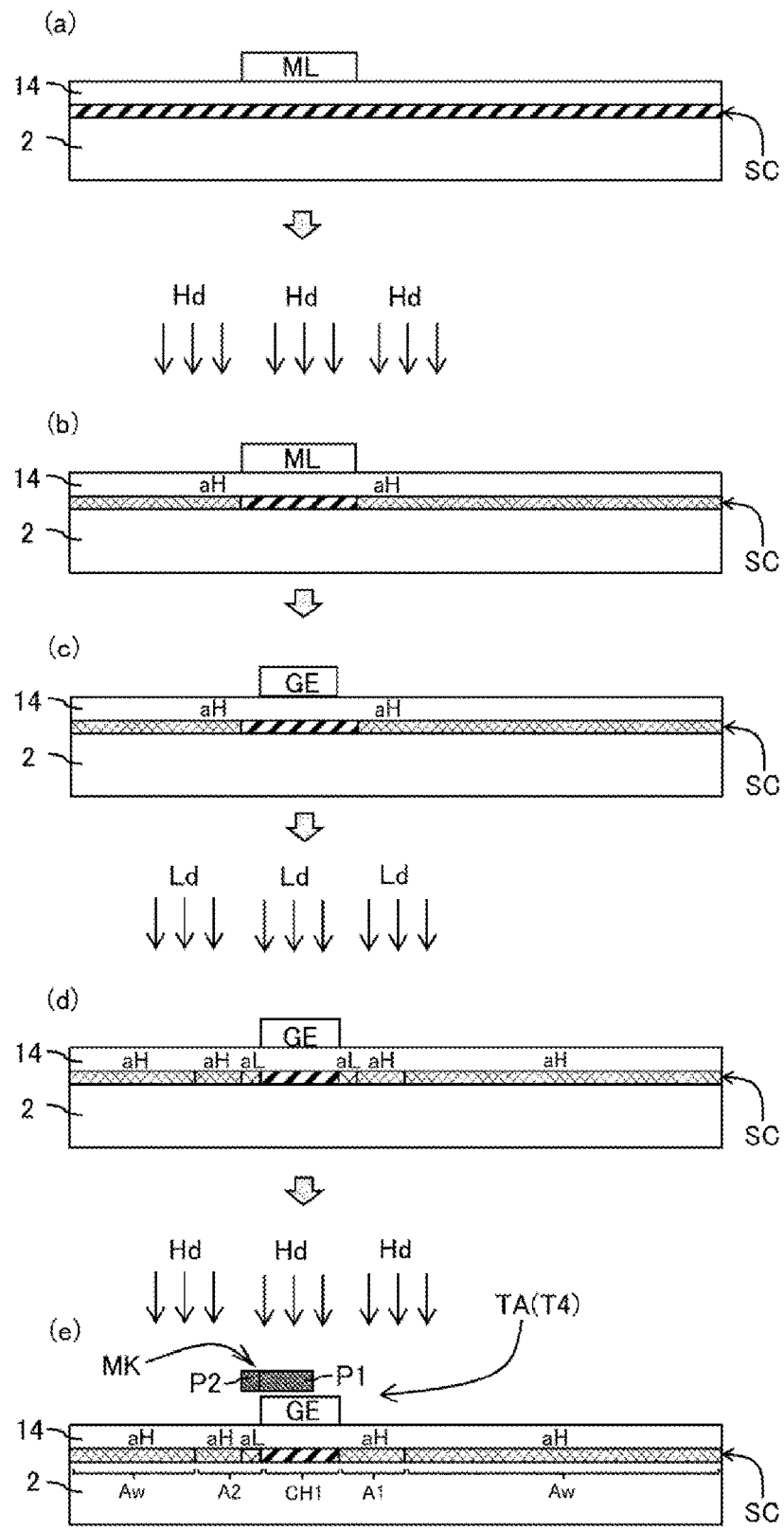
FIG. 10 is a cross-sectional view illustrating a method for manufacturing a transistor having a first structure according to the second embodiment.
Figure 11:
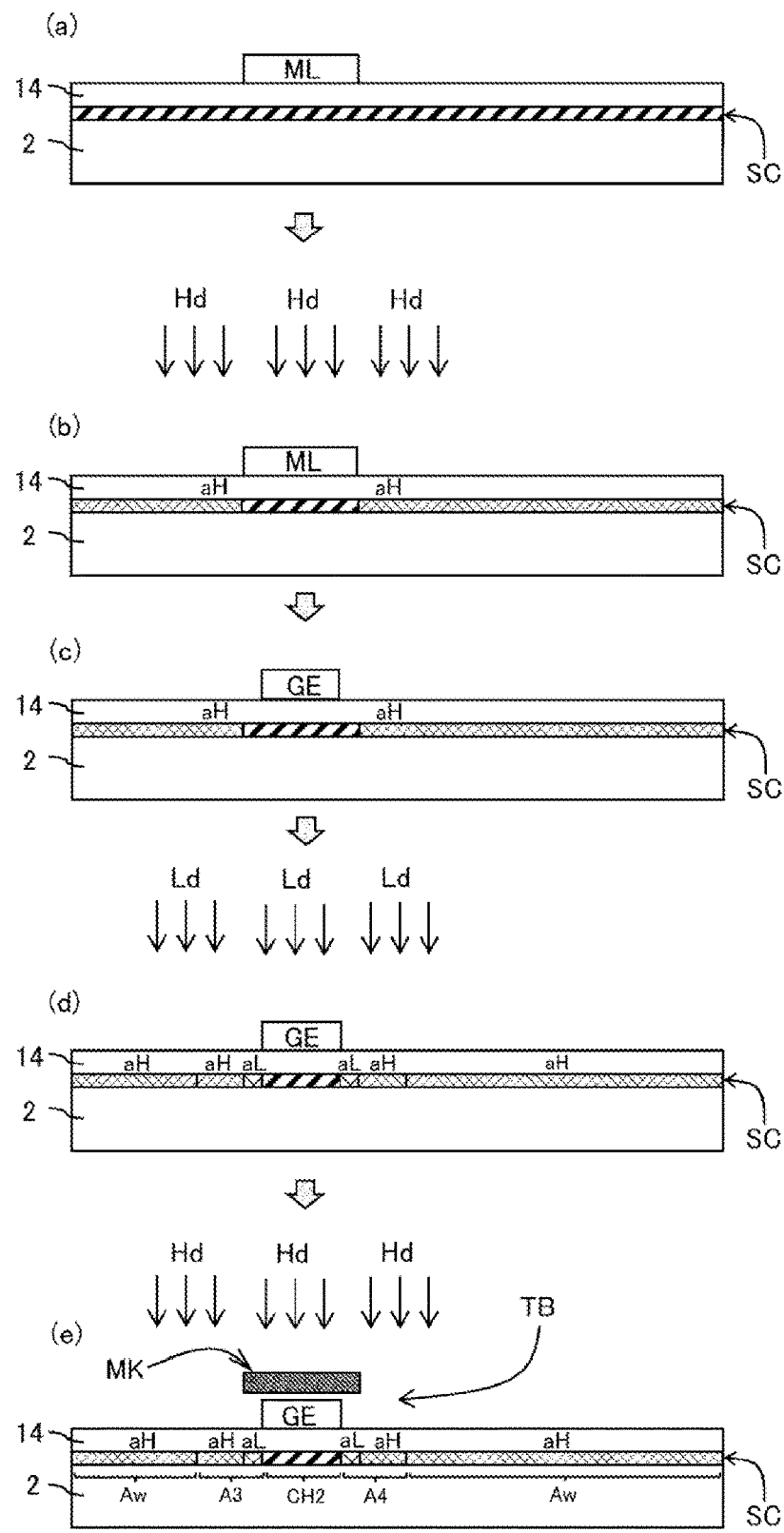
FIG. 11 is a cross-sectional view illustrating a method for manufacturing a transistor having a second structure according to the second embodiment.
Figure 12:
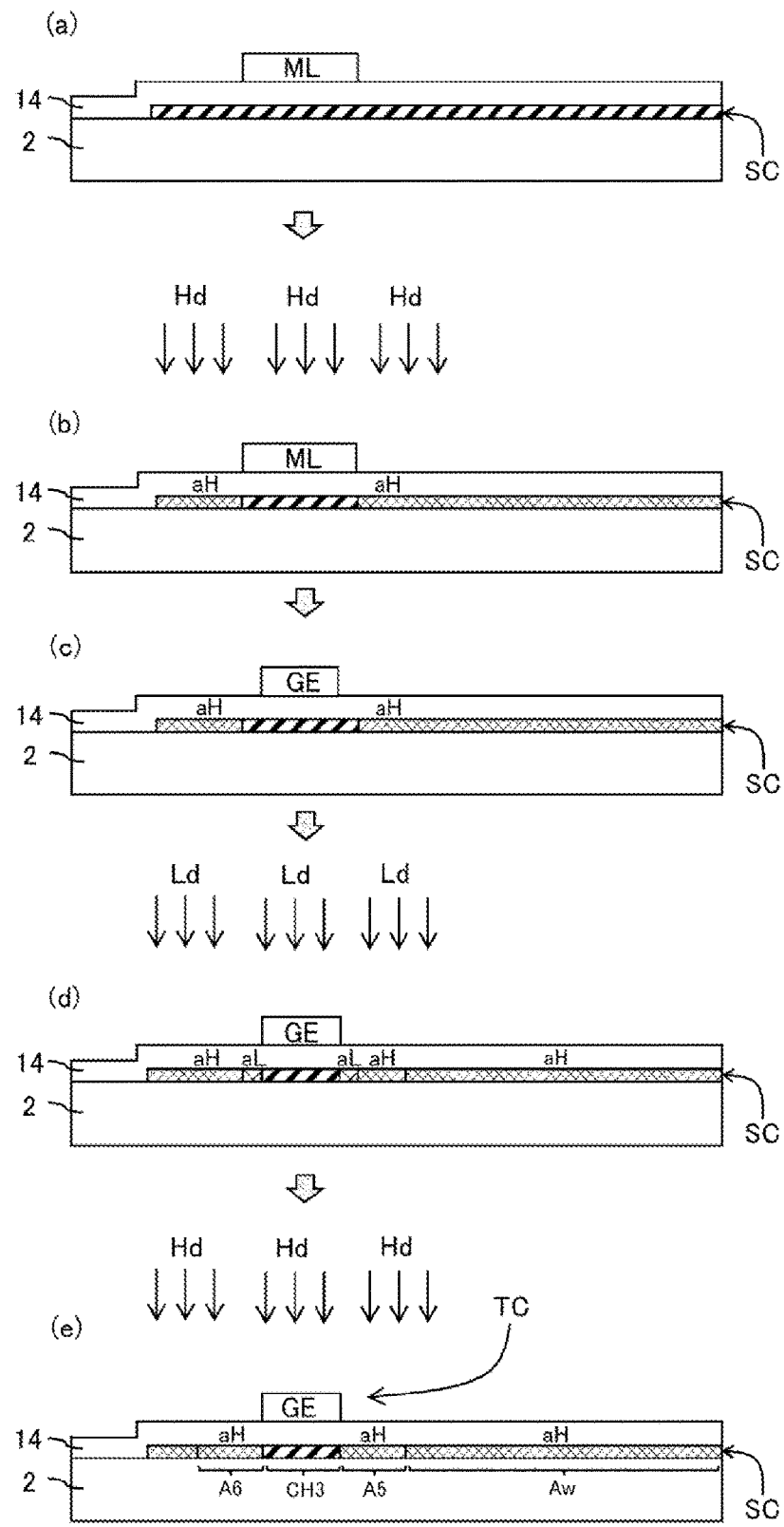
FIG. 12 is a cross-sectional view illustrating a method for manufacturing a transistor having a third structure according to the second embodiment.

FIG. 9 is a flowchart illustrating a method for manufacturing a display device according to a second embodiment. FIG. 10 is a cross-sectional view illustrating a method for manufacturing a transistor having a first structure according to the second embodiment. FIG. 11 is a cross-sectional view illustrating a method for manufacturing a transistor having a second structure according to the second embodiment. FIG. 12 is a cross-sectional view illustrating a method for manufacturing a transistor having a third structure according to the second embodiment.

Step S1 to Step S8 in FIG. 9 are similar to those in the first embodiment, and in Step S9, a first metal layer is patterned by a photolithography method to form a gate layer ML. In Step S10d, the gate layer ML is used as a shield to perform doping at a high concentration on the semiconductor layer SC with an impurity (see FIG. 10(b), FIG. 11(b), and FIG. 12(b)). For example, boron is used as the impurity, and the doping concentration is set to from $1.0 \times 10^{19}$ to $1.0 \times 10^{21}$ [atoms/cm$^3$], for example. Thus, the high concentration region aH is formed.

In Step S10e, the gate layer ML is thinned by etching to form the gate electrode GE (see FIG. 10(c), FIG. 11(c), and FIG. 12(c)).

In Step S10f, as in the first embodiment, the gate electrode GE is used as a shield to perform doping at a low concentration with an impurity on the semiconductor layer SC (see FIG. 10(d), FIG. 11(d), and FIG. 12(d)). For example, boron is used as the impurity, and the doping concentration is set to from $3.0 \times 10^{16}$ to $2 \times 10^{17}$ [atoms/cm$^3$], for example. Thus, the low concentration region aL is formed.

In Step S10s, as in the first embodiment, the gate electrode GE and the mask MK are used as shields to perform doping at a high concentration on the semiconductor layer SC with an impurity (see FIG. 10(e), FIG. 11(e), and FIG. 12(e)). For example, boron is used as the impurity, and the doping concentration is set to from $1.0 \times 10^{19}$ to $1.0 \times 10^{21}$ [atoms/cm$^3$], for example. Thus, the high concentration region aH is formed. Steps S11 to S21 in FIG. 9 are similar to those in the first embodiment.

The embodiments described above are for the purpose of illustration and description and are not intended to be limiting. It will be apparent to those skilled in the art that many variations will be possible in accordance with these examples and descriptions.

Supplement

First Aspect

A display device including a light-emitting element and a pixel circuit including a transistor including a first structure,
wherein a semiconductor layer of the transistor including the first structure includes a first channel region, a first doped region adjacent to one side of the first channel region, and a second doped region adjacent to the other side of the first channel region,
the first doped region is constituted by a high concentration region doped with an impurity at a high concentration,
the second doped region is constituted by a low concentration region adjacent to the first channel region, the low concentration region being doped with an impurity at a low concentration, and a high concentration region adjacent to the low concentration region, the high concentration region being doped with an impurity at a high concentration,
the pixel circuit includes a drive transistor serving as the transistor including the first structure and a capacitance element connected to a gate electrode of the drive transistor, and
a drive current flows from the first doped region to the second doped region of the drive transistor in a light emission period of the light-emitting element.

Second Aspect

The display device according to, for example, the first aspect,
wherein the pixel circuit includes a transistor including a second structure,
a semiconductor layer of the transistor including the second structure includes a second channel region, a third doped region adjacent to one side of the second channel region, and a fourth doped region adjacent to the other side of the second channel region,
the third doped region includes a low concentration region adjacent to the second channel region, the low concentration region being doped with an impurity at a low concentration, and a high concentration region adjacent to the low concentration region, the high concentration region being doped with an impurity at a high concentration, and
the fourth doped region includes a low concentration region adjacent to the second channel region, the low concentration region being doped with an impurity at a low concentration, and a high concentration region adjacent to the low concentration region, the high concentration region being doped with an impurity at a high concentration.

Third Aspect

The display device according to, for example, the second aspect,
wherein the pixel circuit includes a threshold control transistor serving as the transistor including the second structure, the threshold control transistor being connected to a scanning signal line of a current stage and a gate electrode of the drive transistor.

Fourth Aspect

The display device according to, for example, the third aspect,
wherein the pixel circuit includes the transistor including the second structure connected in series to the threshold control transistor.

Fifth Aspect

The display device according to, for example, the second aspect,
wherein the pixel circuit includes a reset transistor serving as the transistor including the second structure, the reset transistor being connected to a scanning signal line and an initialization signal line of a stage before a current stage.

Sixth Aspect

The display device according to, for example, the fifth aspect,
wherein the pixel circuit includes the transistor including the second structure, the transistor being connected in series to the reset transistor.

Seventh Aspect

The display device according to, for example, any one of the first to sixth aspects,
wherein the pixel circuit includes a transistor including a third structure, and
a semiconductor layer of the transistor including the third structure includes a third channel region, a fifth doped region adjacent to one side of the third channel region, and a sixth doped region adjacent to the other side of the third channel region, and
each of the fifth doped region and the sixth doped region is constituted by a high concentration region doped with an impurity at a high concentration.

Eighth Aspect

The display device according to, for example, the seventh aspect,
wherein the first doped region is connected to a power supply via a power supply control transistor serving as the transistor including the third structure.

Ninth Aspect

The display device according to, for example, the seventh aspect,
wherein the second doped region is connected to the light-emitting element via a light emission control transistor serving as the transistor including the third structure.

Tenth Aspect

The display device according to, for example, the seventh aspect,
wherein the first doped region is connected to a data signal line via a writing control transistor serving as the transistor including the third structure.

Eleventh Aspect

The display device according to, for example, the seventh aspect,
wherein an anode of the light-emitting element is connected to an initialization signal line via an initialization transistor serving as the transistor including the third structure.

Twelfth Aspect

The display device according to, for example, any one of the first to eleventh aspects,
wherein a gate electrode of the transistor including the first structure and the first channel region are aligned with each other.

Thirteenth Aspect

The display device according to, for example, any one of the first to twelfth aspects,
wherein the transistor including the first structure is a top gate type.

Fourteenth Aspect

The display device according to, for example, any one of the first to thirteenth aspects,
wherein the transistor including the first structure is a P-channel type, and
the first doped region is a source region and the second doped region is a drain region.

Fifteenth Aspect

The display device according to, for example, any one of the first to fourteenth aspects,
wherein the semiconductor layer contains crystalline silicon.

Sixteenth Aspect

A method for manufacturing a display device including a transistor including a first structure including a semiconductor layer and a gate electrode, the method including
forming the semiconductor layer,
forming the gate electrode,
performing doping on a region of the semiconductor layer not overlapping the gate electrode with an impurity at a low concentration while using the gate electrode as a shield, and
using a mask including a first portion overlapping the gate electrode and a second portion overlapping any one of both sides of the gate electrode, and performing doping on a region of the semiconductor layer overlapping neither the mask nor the gate electrode with an impurity at a concentration higher than the low concentration while using the mask and the gate electrode as shields.

Seventeenth Aspect

The method for manufacturing the display device according to, for example, the sixteenth aspect, further including
between the forming the semiconductor layer and the forming the gate electrode,
forming a gate layer serving as a metal layer, and performing doping on the region of the semiconductor layer not overlapping the gate layer with an impurity at a concentration higher than the low concentration while using the gate layer as a shield,
wherein in the forming the gate electrode, the gate layer is thinned by etching and the gate electrode is formed.

Eighteenth Aspect

The method for manufacturing the display device according to, for example, the sixteenth aspect,
wherein the semiconductor layer includes a first channel region overlapping the gate electrode, a first doped region adjacent to one side of the first channel region, and a second doped region adjacent to the other side of the first channel region,
the first doped region is constituted by a high concentration region doped with an impurity at a high concentration, and
the second doped region is constituted by a low concentration region corresponding to the second portion of the mask, the low concentration region being doped with an impurity at a low concentration, and a high concentration region adjacent to the low concentration region, the high concentration region being doped with an impurity at a high concentration.

The invention claimed is:
1. A display device comprising:
a light-emitting element; and
a pixel circuit including a transistor including a first structure,
wherein a semiconductor layer of the transistor including the first structure includes a first channel region, a first doped region adjacent to one side of the first channel region, and a second doped region adjacent to another side of the first channel region,
the first doped region is constituted by a high concentration region doped with an impurity at a high concentration,
the second doped region is constituted by a low concentration region adjacent to the first channel region, the low concentration region being doped with an impurity at a low concentration, and a high concentration region adjacent to the low concentration region, the high concentration region being doped with an impurity at a high concentration, the pixel circuit includes a drive transistor serving as the transistor including the first structure and a capacitance element connected to a gate electrode of the drive transistor, a drive current flows from the first doped region to the second doped region of the drive transistor in a light emission period of the light-emitting element, the pixel circuit includes a transistor including a second structure, a semiconductor layer of the transistor including the second structure includes a second channel region, a third doped region adjacent to one side of the second channel region, and a fourth doped region adjacent to another side of the second channel region, the third doped region includes a low concentration region adjacent to the second channel region, the low concentration region being doped with an impurity at a low concentration, and a high concentration region adjacent to the low concentration region, the high concentration region being doped with an impurity at a high concentration, the fourth doped region includes a low concentration region adjacent to the second channel region, the low concentration region being doped with an impurity at a low concentration, and a high concentration region adjacent to the low concentration region, the high concentration region being doped with an impurity at a high concentration, and the pixel circuit includes a threshold control transistor serving as the transistor including the second structure, the threshold control transistor being connected to a scanning signal line of a current stage and a gate electrode of the drive transistor.

2. The display device according to claim 1, wherein the pixel circuit includes the transistor including the second structure connected in series to the threshold control transistor.

3. The display device according to claim 1,
wherein the pixel circuit includes a transistor including a third structure, and
a semiconductor layer of the transistor including the third structure includes a third channel region, a fifth doped region adjacent to one side of the third channel region, and a sixth doped region adjacent to another side of the third channel region, and
each of the fifth doped region and the sixth doped region is constituted by a high concentration region doped with an impurity at a high concentration.

4. The display device according to claim 3,
wherein the first doped region is connected to a power supply via a power supply control transistor serving as the transistor including the third structure.

5. The display device according to claim 3,
wherein the second doped region is connected to the light-emitting element via a light emission control transistor serving as the transistor including the third structure.

6. The display device according to claim 3,
wherein the first doped region is connected to a data signal line via a writing control transistor serving as the transistor including the third structure.

7. The display device according to claim 3,
wherein an anode of the light-emitting element is connected to an initialization signal line via an initialization transistor serving as the transistor including the third structure.

8. The display device according to claim 1,
wherein a gate electrode of the transistor including the first structure and the first channel region are aligned with each other.

9. The display device according to claim 1,
wherein the transistor including the first structure is a top gate type.

10. The display device according to claim 1,
wherein the transistor including the first structure is a P-channel type, and
the first doped region is a source region and the second doped region is a drain region.

11. The display device according to 1,
wherein the semiconductor layer contains crystalline silicon.

12. A display device comprising:
a light-emitting element; and
a pixel circuit including a transistor including a first structure,
wherein a semiconductor layer of the transistor including the first structure includes a first channel region, a first doped region adjacent to one side of the first channel region, and a second doped region adjacent to another side of the first channel region, the first doped region is constituted by a high concentration region doped with an impurity at a high concentration, the second doped region is constituted by a low concentration region adjacent to the first channel region, the low concentration region being doped with an impurity at a low concentration, and a high concentration region adjacent to the low concentration region, the high concentration region being doped with an impurity at a high concentration, the pixel circuit includes a drive transistor serving as the transistor including the first structure and a capacitance element connected to a gate electrode of the drive transistor, a drive current flows from the first doped region to the second doped region of the drive transistor in a light emission period of the light-emitting element, the pixel circuit includes a transistor including a second structure, a semiconductor layer of the transistor including the second structure includes a second channel region, a third doped region adjacent to one side of the second channel region, and a fourth doped region adjacent to another side of the second channel region, the third doped region includes a low concentration region adjacent to the second channel region, the low concentration region being doped with an impurity at a low concentration, and a high concentration region adjacent to the low concentration region, the high concentration region being doped with an impurity at a high concentration, the fourth doped region includes a low concentration region adjacent to the second channel region, the low concentration region being doped with an impurity at a low concentration, and a high concentration region adjacent to the low concentration region, the high concentration region being doped with an impurity at a high concentration, and the pixel circuit includes a reset transistor serving as the transistor including the second structure, the reset transistor being connected to a scanning signal line and an initialization signal line of a stage before a current stage.

13. The display device according to claim 12,
wherein the pixel circuit includes the transistor including the second structure, the transistor being connected in series to the reset transistor.

14. The display device according to claim 12,
wherein the pixel circuit includes a transistor including a third structure, and
a semiconductor layer of the transistor including the third structure includes a third channel region, a fifth doped region adjacent to one side of the third channel region, and a sixth doped region adjacent to another side of the third channel region, and
each of the fifth doped region and the sixth doped region is constituted by a high concentration region doped with an impurity at a high concentration.

15. The display device according to claim 14,
wherein the first doped region is connected to a power supply via a power supply control transistor serving as the transistor including the third structure.

16. The display device according to claim 14,
wherein the second doped region is connected to the light-emitting element via a light emission control transistor serving as the transistor including the third structure.

17. The display device according to claim 14,
wherein the first doped region is connected to a data signal line via a writing control transistor serving as the transistor including the third structure.

18. The display device according to claim 14,
wherein an anode of the light-emitting element is connected to an initialization signal line via an initialization transistor serving as the transistor including the third structure.

19. A method for manufacturing a display device including a transistor including a first structure including a semiconductor layer and a gate electrode, the method comprising:
forming the semiconductor layer;
forming the gate electrode;
performing doping on a region of the semiconductor layer not overlapping the gate electrode with an impurity at a low concentration while using the gate electrode as a shield; and
using a mask including a first portion overlapping the gate electrode and a second portion overlapping any one of both sides of the gate electrode, and performing doping on a region of the semiconductor layer overlapping neither the mask nor the gate electrode with an impurity at a concentration higher than the low concentration while using the mask and the gate electrode as shields, and
the method further comprising:
between the forming the semiconductor layer and the forming the gate electrode,
forming a gate layer serving as a metal layer, and performing doping on the region of the semiconductor layer not overlapping the gate layer with an impurity at a concentration higher than the low concentration while using the gate layer as a shield,
wherein in the forming the gate electrode, the gate layer is thinned by etching and the gate electrode is formed.

* * * * *